(12) United States Patent
Yoon (10) Patent No.: US 9,660,090 B2
(45) Date of Patent: May 23, 2017

(54) ARRAY SUBSTRATE

(71) Applicant: LG DISPLAY CO., LTD., Seoul (KR)

(72) Inventor: Joong-Sun Yoon, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/518,726

(22) Filed: Oct. 20, 2014

(65) Prior Publication Data

US 2015/0187959 A1    Jul. 2, 2015

(30) Foreign Application Priority Data

Dec. 26, 2013  (KR) .......................... 10-2013-0163900

(51) Int. Cl.
*H01L 27/32*  (2006.01)
*H01L 29/786*  (2006.01)
*H01L 27/12*  (2006.01)

(52) U.S. Cl.
CPC ...... *H01L 29/78633* (2013.01); *H01L 27/124* (2013.01); *H01L 27/1225* (2013.01); *H01L 27/3272* (2013.01); *H01L 29/7869* (2013.01)

(58) Field of Classification Search
CPC ....... H01L 29/786; H01L 27/32; H01L 27/12; H01L 29/78633; H01L 27/1225; H01L 27/124; H01L 27/3272; H01L 27/3262; H01L 27/1248; H01L 27/1222; H01L 27/1251; H01L 27/3276; H01L 27/1262; H01L 27/127; H01L 27/1288
USPC ............................ 257/43, 71, 93, 72, 40, 51
See application file for complete search history.

(56) References Cited

U.S. PATENT DOCUMENTS

| | | | |
|---|---|---|---|
| 2002/0008798 A1* | 1/2002 | Song et al. | 349/43 |
| 2004/0140515 A1 | 7/2004 | Yasukawa | |
| 2004/0141515 A1 | 7/2004 | Xiao | |
| 2008/0062112 A1* | 3/2008 | Umezaki | G09G 3/342 345/100 |
| 2010/0123947 A1* | 5/2010 | Cho et al. | 359/292 |
| 2013/0256652 A1* | 10/2013 | Lee | H01L 29/786 257/43 |
| 2013/0300968 A1 | 11/2013 | Okajima et al. | |
| 2014/0055690 A1* | 2/2014 | Song et al. | 349/12 |

FOREIGN PATENT DOCUMENTS

GB    2521727 A8    7/2015

\* cited by examiner

*Primary Examiner* — Chuong A Luu
*Assistant Examiner* — Rodolfo D Fortich
(74) *Attorney, Agent, or Firm* — Dentons US LLP (57) ABSTRACT

An array substrate having a thin film transistor with an oxide semiconductor layer, wherein the thin film transistor is in a device area of a pixel region; the substrate comprising a light-shielding pattern on the array substrate in the device area; an auxiliary line connected to a light-shielding pattern and supplying a constant voltage to the light-shielding pattern, wherein the auxiliary line is parallel to and spaced apart from one of the gate and data lines; a buffer layer on the light-shielding pattern and a surface of the array substrate, wherein the oxide semiconductor layer is on the buffer layer and the light-shielding pattern; an inter-insulating layer on the buffer layer, wherein the oxide semiconductor layer includes an active portion located entirely on the light-shielding pattern and having a channel formed thereon, and conductive portions located on sides of the active portion.

20 Claims, 8 Drawing Sheets

ARRAY SUBSTRATE

This application claims the benefit of Korean Patent Application No. 10-2013-0163900, filed on Dec. 26, 2013, which is hereby incorporated by reference for all purposes as if fully set forth herein.

BACKGROUND OF THE INVENTION

Field of the Invention

The present invention relates to an array substrate. More particularly, the present invention relates to an array substrate including a thin film transistor with an oxide semiconductor layer in which reliability of the thin film transistor is obtained by restraining characteristics of the thin film transistor from varying due to light incident on the substrate.

Discussion of the Related Art

With rapid development of information technologies, display devices for displaying a large amount of information have been developed. More particularly, flat panel display (FPD) devices having a thin profile, light weight and low power consumption such as liquid crystal display (LCD) devices, plasma display panel (PDP) devices, field emission display (FED) devices, electroluminescence display (ELD) devices, and organic light emitting diode display (OLED) devices, which may be referred to as an organic electroluminescent display devices, have been actively pursued to replace the cathode ray tubes (CRTs).

Among these devices, liquid crystal display devices have been widely used for monitors for notebook computers and personal computers or televisions because of their high contrast ratio, superiority in displaying moving images, and low power consumption. The performance of liquid crystal display devises is based upon optical anisotrophy and polarization properties of liquid crystal molecules with the device. Liquid crystal molecules have a definite alignment direction as a result of their thin and long shapes. The alignment direction of the liquid crystal molecules can be controlled by applying an electric field across the liquid crystal molecules.

In addition, organic electroluminescent display devices have been recently drawn interest because of their many beneficial characteristics such as high brightness and low driving voltages. Because they are self-luminous, the organic electroluminescent display devices have excellent contrast ratios and ultra thin thicknesses. The organic electroluminescent display devices have a response time of several micro seconds, and have an advantage in displaying moving images. Also, the organic electroluminescent display devices have wide viewing angles and are stable under low temperatures. Since the organic electroluminescent display devices are driven by a low voltage of direct current (DC) 5V to 15V, it is easy to design and manufacture driving circuits; and the manufacturing processes of the organic electroluminescent display device are simple since only deposition and encapsulation steps are required.

Each of the liquid crystal display devices and the organic electroluminescent display devices includes an array substrate having thin film transistors as switching elements to control their respective pixels.

The array substrate also includes gate and data lines crossing each other to define pixel regions, and at least one or two thin film transistors functioning as a switching or driving element are formed in each pixel region.

The thin film transistor has various structures depending on materials for a semiconductor layer.

Namely, the semiconductor layer may be formed of amorphous silicon, an oxide semiconductor material, or polycrystalline silicon, and the thin film transistor may have a top gate or a bottom gate structure due to the material for the semiconductor layer.

Recently, an array substrate having a thin film transistor with an oxide semiconductor layer of an oxide semiconductor material has attracted attention.

A thin film transistor having an oxide semiconductor layer has superior conductivity of carriers as compared with a thin film transistor having a semiconductor layer of amorphous silicon, and its fabrication is simplified in comparison with a thin film transistor having a semiconductor layer of polycrystalline silicon because the thin film transistor having an oxide semiconductor layer does not need processes such as doping impurities.

Figure 1A:
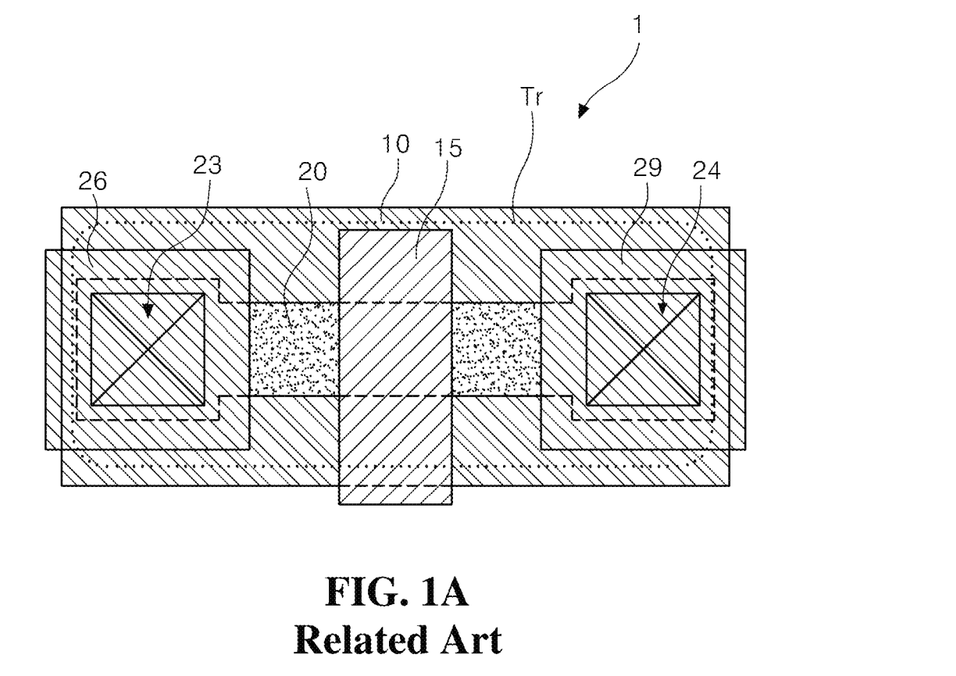
FIG. 1A is a schematic plan view illustrating an array substrate having a thin film transistor with an oxide semiconductor layer according to the related art.

FIG. 1A is a schematic plan view illustrating an array substrate having a thin film transistor with an oxide semiconductor layer according to the related art.

In FIG. 1A, the related art array substrate 1 has a thin film transistor Tr, and the thin film transistor Tr includes an oxide semiconductor layer 20, a gate insulating layer (not shown), a gate electrode 15, an inter-insulating layer (not shown) having semiconductor layer contact holes 23 and 24, and a source electrode 26 and a drain electrode 29 spaced apart from each other. The source and drain electrodes 26 and 29 contact the oxide semiconductor layer 20 through the semiconductor layer contact holes 23 and 24, respectively.

The thin film transistor Tr including the oxide semiconductor layer 20 is sensitive to light. Therefore, characteristics of the thin film transistor Tr including the oxide semiconductor layer 20 are changed due to light incident on the oxide semiconductor layer 20 and driving reliability of the thin film transistor Tr including the oxide semiconductor layer 20 is lowered for each location based upon the incident light.

To solve the problem, a structure for screening the light incident on the oxide semiconductor layer 20 has been introduced.

That is, a light-shielding pattern 10 with an area corresponding to the thin film transistor Tr, which is floating, is formed under the oxide semiconductor layer 20 to screen the light incident on the oxide semiconductor layer 20.

However, the light-shielding pattern 10 is differently charged for each location, and an undesirable channel is caused in the oxide semiconductor layer 20. Thus, the characteristics of the thin film transistor Tr are lowered, and image qualities of a display device decrease.

Figure 1B:
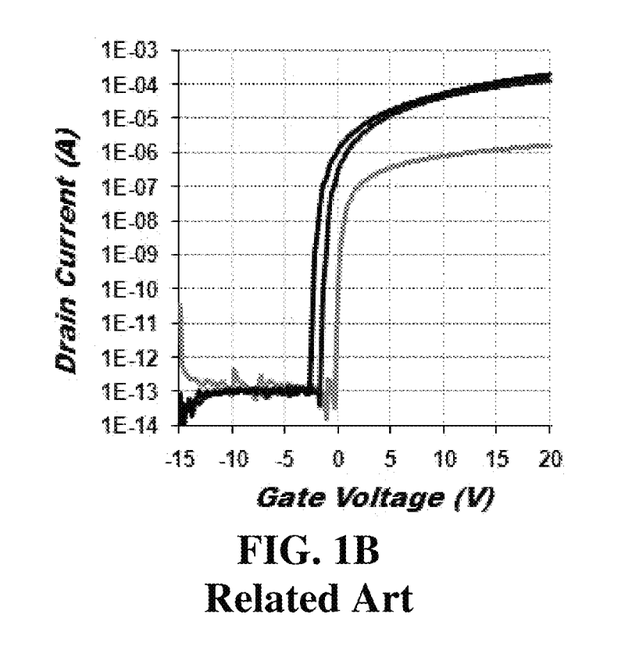
FIG. 1B is a graph showing current-voltage characteristics of the thin film transistor according to the related art.

Namely, in a graph showing current-voltage characteristics of the thin film transistor Tr, as shown in FIG. 1B, there is a difference between effective gate voltages due to a difference in quantities of electric charges charged in the light-shielding pattern 10, and this causes a difference in drain currents. Therefore, current-voltage curves are shifted, degrees of the shifts of the curves are varied according to drain voltages, and the threshold voltage of the thin film transistor Tr is changed. Accordingly, the characteristics and reliability of the thin film transistor Tr are lowered.

SUMMARY OF THE INVENTION

Accordingly, the present invention is directed to an array substrate including a thin film transistor with an oxide semiconductor layer that substantially obviates one or more of the problems due to limitations and disadvantages of the related art.

An advantage of the present invention is to provide an array substrate including a thin film transistor with an oxide semiconductor layer that prevents the characteristics of a thin film transistor from being lowered due to incident light and obtains better reliability.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an array substrate includes: An array substrate having a thin film transistor with an oxide semiconductor layer, comprising: gate and data lines formed on the array substrate and defining a pixel region, wherein the thin film transistor is located in a device area of the pixel region; a light-shielding pattern arranged on the array substrate in the device area; an auxiliary line connected to the light-shielding pattern and supplying a constant voltage to the light-shielding pattern, wherein the auxiliary line is parallel to and spaced apart from one of the gate and data lines; a buffer layer of an inorganic material and located on the light-shielding pattern and a surface of the array substrate, wherein the oxide semiconductor layer is located on the buffer layer and the light-shielding pattern; an inter-insulating layer on the buffer layer, wherein the oxide semiconductor layer includes an active portion located entirely on the light-shielding pattern and having a channel formed thereon, and conductive portions located on sides of the active portion. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 2:
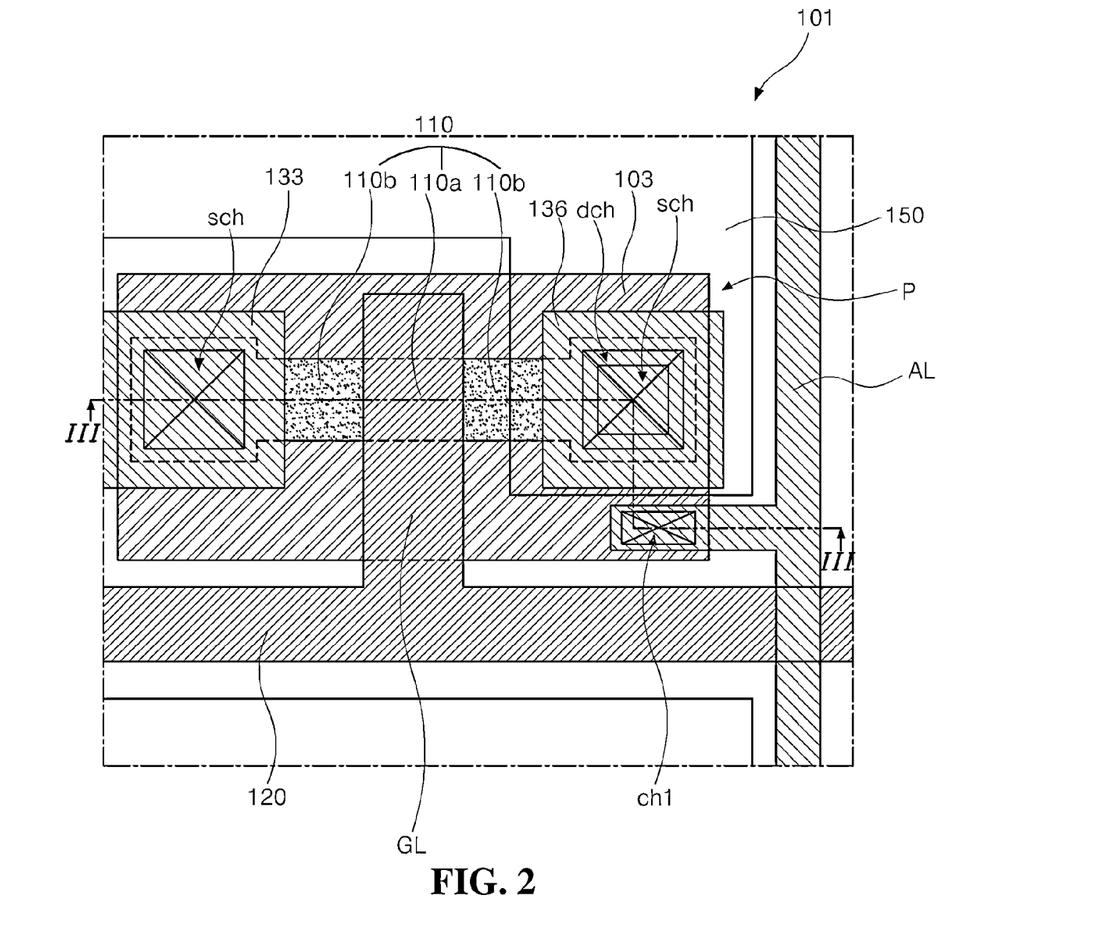
FIG. 2 is a plan view illustrating part of an array substrate having a thin film transistor with an oxide semiconductor layer according to a first embodiment of the present invention.
Figure 3:
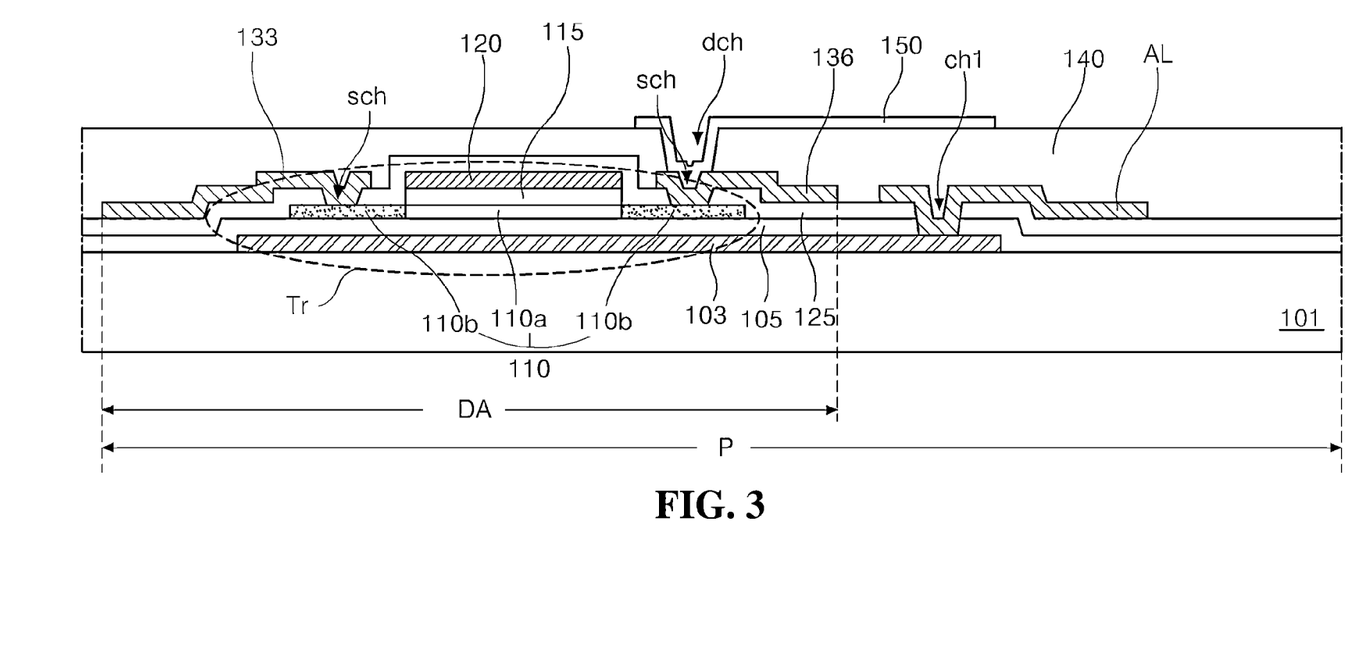
FIG. 3 is a cross-sectional view taken along the line III-III of FIG. 2.

FIG. 2 is a plan view illustrating part of an array substrate having a thin film transistor with an oxide semiconductor layer according to a first embodiment of the present invention, and FIG. 3 is a cross-sectional view taken along the line III-III of FIG. 2. For convenience of explanation, a region where the thin film transistor Tr is located is defined as a device area DA.

In FIGS. 2 and 3, the thin film transistor Tr with the oxide semiconductor layer 110 as switching and/or driving elements is formed in each pixel region P of the array substrate 101 according to the first embodiment of the present invention.

Although not shown in the figures, a gate line and a data line are also formed and cross each other to define the pixel region P.

Here, when the thin film transistor Tr functions as a switching thin film transistor of a liquid crystal display device or an organic light emitting diode display device, the thin film transistor Tr is connected to the gate and data lines (not shown). When the thin film transistor Tr functions as a driving thin film transistor of an organic light emitting diode display device, the thin film transistor Tr is not directly connected to the gate and data lines (not shown) and is selectively connected to a switching thin film transistor (not shown), a power line (not shown) and a pixel electrode 150.

A light-shielding pattern 103 absorbing or reflecting light and having a conductive property is formed in each device area DA. The light-shielding pattern 103 may be formed of a metallic material or a semiconductor material.

The semiconductor material may be amorphous silicon, polycrystalline silicon or an oxide semiconductor material. Further, the semiconductor material may be impurity-doped amorphous silicon, a conducted oxide semiconductor material or impurity-doped polycrystalline silicon having improved conductive property.

Additionally, in the array substrate 101 according to the first embodiment of the present invention, an auxiliary line AL is formed on a different layer from the light-shielding pattern 103 and is connected to the light-shielding pattern 103 through a first contact hole ch1. Alternatively, the auxiliary line AL may be formed on the same layer as the light-shielding pattern 103 and may be connected to the light-shielding pattern 103 to form one-united body. The auxiliary line AL may be parallel to and spaced apart from the gate line (not shown) or the data line (not shown).

One ends of respective auxiliary lines AL are connected to each other in a non-display area outside a display area and are connected to a power supply means (not shown) or a ground (not shown) such that a constant voltage may be applied to respective light-shielding patterns 103.

When the auxiliary line AL is formed on the same layer as the light-shielding pattern 103, that is, on the substrate 101, the auxiliary line AL is formed of the same material as the light-shielding pattern 103. On the other hand, when the auxiliary line AL is formed on a different layer from the light-shielding pattern 103, the auxiliary line AL is formed of the same material as the gate line (not shown) or the data line (not shown).

A buffer layer 105 is formed on the light-shielding pattern 103 all over the substrate 101. The buffer layer 105 may be formed of an inorganic insulating material such as silicon oxide (SiO2) or silicon nitride (SiNx). The first contact hole ch1 may be formed in the buffer layer 105 to expose a surface of one end of the light-shielding pattern 103. The first contact hole ch1 is used to connect the auxiliary line AL with the light-shielding pattern 103. Alternatively, when the auxiliary line AL is formed on the same layer as the light-shielding pattern 103, the first contact hole ch1 in the buffer layer 105 is omitted. The first contact hole ch1 may be extended into a gate insulating layer 115 or an inter-insulating layer 125 according to a position of the auxiliary line AL.

The oxide semiconductor layer 110 is an island shape, is formed on the buffer layer 105, and overlaps the light-shielding pattern 103. The oxide semiconductor layer 110 is formed of an oxide semiconductor material such as indium gallium zinc oxide (IGZO), zinc tin oxide (ZTO) or zinc indium oxide (ZIO).

Meanwhile, the oxide semiconductor layer 110 having an island shape includes two portions. Namely, the oxide semiconductor layer 110 includes an active portion 110a where a channel is formed, and conductive portions 110b having conductive properties and located both sides of the active portion 110a.

The conductive portions 110b may have the improved conductive properties by performing a treatment process so that oxygen therein gets out to the outside to thereby improve the contact resistance property with the source and drain electrodes 133 and 136 of a metallic material.

The active portion 110a is completely on the light-shielding pattern 103, and light incident on a bottom surface of the active portion 110a is prevented by the light-shielding pattern 103. In addition, light incident on a top surface of the active portion 110a is prevented by a gate electrode 120.

Therefore, in the array substrate 101 having the thin film transistor Tr with the oxide semiconductor layer 110 according to the first embodiment of the present invention, exterior light incident on the oxide semiconductor layer 110, and more particularly, on the active portion 110a, is blocked, and photocurrents are restrained from being generated in the active portion 110a. Thus, the characteristics of the thin film transistor Tr are prevented from being lowered.

The gate insulating layer 115 and the gate electrode 120 are sequentially formed on the oxide semiconductor layer 110. More particularly, they may be formed on the active portion 110a. The gate insulating layer 115 and the gate electrode 120 have the same plane shape. The gate insulating layer 115 is formed of an inorganic insulating material, and the gate electrode 120 is formed of a metallic material having relatively low resistivity. Beneficially, the metallic material may have resistivity equal to or less than $10^3$ Ω·m, and more beneficially, may have resistivity within a range of $10^{-6}$ to $10^{-9}$ Ω·m. The metallic material may be formed of one selected from transition metals, post transition metals, and poly-crystallized metalloids. For example, the metallic material may include one of titanium (Ti), copper (Cu), molybdenum (Mo), tungsten (W), zinc (Zn), aluminum (Al), polycrystalline silicon (p-Si), and an active channel polymer of indium gallium zinc oxide (IGZO). The gate electrode 120 may have a single-layered structure or a multi-layered structure.

Although not shown in the figures, a gate insulating layer 115 and the gate line (not shown) may be sequentially formed over the buffer layer 105 exposed beyond the oxide semiconductor layer 110. The gate insulating layer 115 and the gate line have the same plane shape. The gate insulating layer 115 is formed of an inorganic insulating material, and the gate line is formed of a metallic material having relatively low resistivity. The gate line may have a single-layered structure or a multi-layered structure.

Accordingly, the gate insulating layer 115 is formed under both the gate electrode 120 and the gate line (not shown).

Here, the gate line (not shown) and the gate electrode 120 may be connected to each other or may be spaced apart from each other depending on the function of the thin film transistor Tr formed in the device area DA.

When the thin film transistor Tr functions as a switching thin film transistor, the gate electrode 120 and the gate line (not shown) are connected to each other. On the other hand, when the thin film transistor Tr functions as a driving thin film transistor, the gate electrode 120 is not connected to and is spaced apart from the gate line (not shown).

At this time, the inorganic insulating material of the gate insulating layer may be silicon oxide (SiO2) or silicon nitride (SiNx), for example. The metallic material of the gate electrode and gate line having relative low resistivity may be one of aluminum (Al), aluminum alloy such as aluminum neodymium (AlNd), copper (Cu), copper alloy, molybdenum (Mo) and molybdenum alloy such as molybdenum titanium (MoTi), for example.

When the gate line and the gate electrode 120 have a single-layered structure, the gate line and the gate electrode 120 may be formed of one selected from the above-mentioned metallic materials. When the gate line and the gate electrode 120 have a multi-layered structure, the gate line and the gate electrode 120 may be formed of different ones selected from the above-mentioned metallic materials and sequentially layered, and the gate line and the gate electrode 120 may have a double- or more-layered structure.

Figure 4:
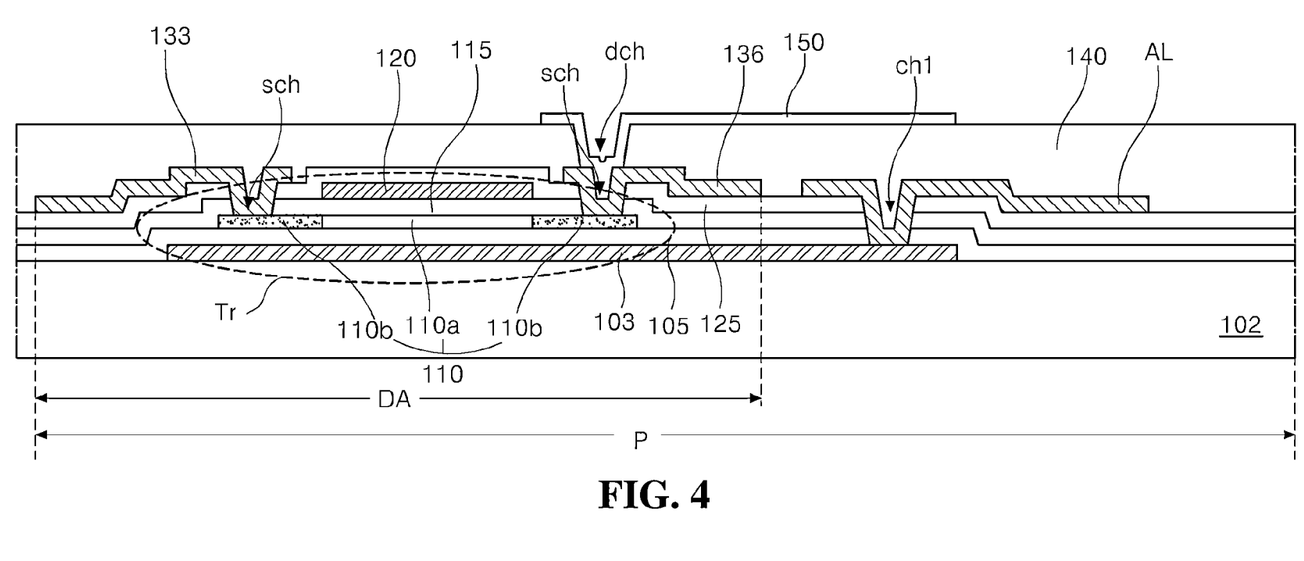
FIG. 4 is a cross-sectional view illustrating an array substrate in another example according to the first embodiment of the present invention.

In the array substrate 101 according to the first embodiment of the invention, although the gate insulating layer 115 is formed in a region corresponding to the gate electrode 120 and the gate line (not shown), the gate insulating layer 115 may be formed all over the substrate 102 as shown in FIG. 4. FIG. 4 is a cross-sectional view illustrating an array substrate in another example according to the first embodiment of the present invention. In the array substrate 102 of FIG. 4, the conductive portions 110b of the oxide semiconductor layer 110 may correspond to only the semiconductor layer contact holes sch.

The array substrate 102 of FIG. 4 has the same structure as the array substrate 101 of FIG. 3 except for the gate insulating layer 115 and the conductive portions 110b of the oxide semiconductor layer 110, and other explanations will be omitted.

Referring to FIG. 2 and FIG. 3, the inter-insulating layer 125 is formed on the gate electrode 120 and the gate line (not shown) over the whole substrate 101. The inter-insulating layer 125 is formed of an inorganic insulating material such as silicon oxide (SiO2) or silicon nitride (SiNx).

The inter-insulating layer 125 includes semiconductor layer contact holes sch exposing respective conductive portions 110b at both sides of the active portion 110a of the oxide semiconductor layer 110.

The data line (not shown) is formed on the inter-insulating layer 125 having the semiconductor layer contact holes sch. The data line crosses the gate line (not shown) to define the pixel region P.

In addition, the source electrode 133 and the drain electrode 136 are formed in the device area DA on the inter-insulating layer 125. The source electrode 133 contacts one of the conductive portions 110b of the oxide semiconductor layer 110 through one of the semiconductor layer contact holes sch. The drain electrode 136 is spaced apart from the source electrode 133 and contacts the other of the conductive portions 110b of the oxide semiconductor layer 110 through the other of the semiconductor layer contact holes sch.

The oxide semiconductor layer 110, the gate insulating layer 115, the gate electrode 120, the inter-insulating layer 125, and the source and drain electrodes 133 and 136, which are sequentially layered in the device area DA, constitute the thin film transistor Tr.

Additionally, although not shown in the figures, when the thin film transistor Tr functions as a switching element, the source electrode 133 is connected to the data line (not shown).

When the thin film transistor Tr functions as a driving element, the source electrode 133 and the data line (not shown) are not directly connected to each other and are separated from each other. At this time, the source and drain electrodes 133 and 136 of the thin film transistor Tr functioning as a driving element may be respectively connected to the source and drain electrodes (not shown) of the thin film transistor (not shown) functioning as a switching element or may be respectively connected to the drain and source electrodes (not shown) of the thin film transistor (not shown) functioning as a switching element.

Moreover, although not shown in the figures, when the array substrate 101 is used for a liquid crystal display device, a common line (not shown) may be further formed on the same layer as the gate line (not shown) and may be spaced apart from the gate line. Alternatively, when the array substrate 101 is used for an organic light emitting diode display device, a power line (not shown) may be further formed on the same layer as the gate line (not shown) or the data line (not shown) and may be spaced apart from the gate line or the data line.

Furthermore, in the array substrate 101 according to the first embodiment of the present invention, the auxiliary line AL is formed on the same layer as the data line (not shown) and is connected to the light-shielding pattern 103 through the first contact hole ch1, which is formed in the buffer layer 105 and the inter-insulating layer 125. Alternatively, the auxiliary line AL may be formed on the same layer as the gate line (not shown).

Next, a first passivation layer 140 is formed on the thin film transistor Tr and the data line all over the substrate 101. The first passivation layer 140 may be formed of an inorganic insulating material such as silicon oxide (SiO2) or silicon nitride (SiNx) or an organic insulating material such as benzocyclobutene (BCB) or photo acryl.

The first passivation layer 140 has a drain contact hole dch exposing the drain electrode 136 of the thin film transistor Tr. The pixel electrode 150 is formed on the first passivation layer 140 in each pixel region P and is connected to the drain electrode 136 through the drain contact hole dch. Accordingly, the array substrate 101 according to the first embodiment of the present invention is completed.

Here, when the array substrate 101 is used for a liquid crystal display device, the thin film transistor Tr connected to the pixel electrode 150 becomes a switching thin film transistor. When the array substrate 101 is used for an organic light emitting diode display device, the thin film transistor Tr connected to the pixel electrode becomes a driving thin film transistor.

In the array substrate 101 according to the first embodiment of the present invention, the light-shielding pattern 103 corresponding to and overlapped by the whole active portion 110a of the oxide semiconductor layer 110 is not floating, and the light-shielding pattern 103 is directly connected to the auxiliary line AL or contacts the auxiliary line Al through the first contact hole ch1. The auxiliary line AL may be connected to a power supply means (not shown) or a ground (not shown).

Therefore, a constant voltage such as −1V, 0V, or +1V, for example, can be applied to the light-shield pattern 103 corresponding to the thin film transistor Tr in the device area DA of each pixel region P of the display area from the power supply means (not shown) or the ground (not shown) through the auxiliary line AL. The ground may be embodied in a driving circuit board (not shown) for driving the display area.

When the light-shielding pattern 103 is connected to the power supply means or the ground supplying a constant voltage through the auxiliary line AL, the light-shielding pattern 103 may be constantly charged for each location regardless of time. That is, the quantity of electric charges in the light-shielding pattern 103 may be the same for each location and may be constant regardless of time. Thus, the electric potential at the light-shielding pattern 103 may be constant.

Figure 5:
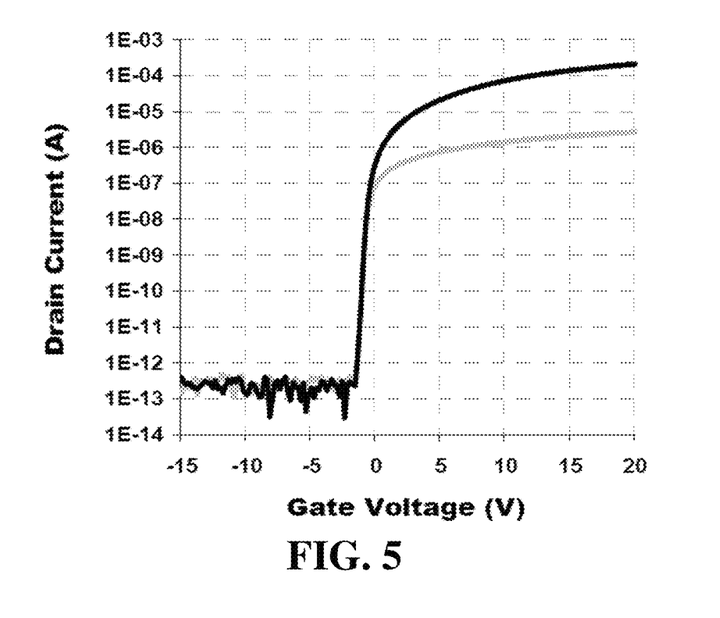
FIG. 5 is a graph showing current-voltage characteristics of the thin film transistor according to the first embodiment of the present invention.

Accordingly, in the array substrate 101 according to the first embodiment of the present invention, as shown in FIG. 5, which is a graph showing current-voltage characteristics of the thin film transistor according to the first embodiment of the present invention, a threshold voltage of the thin film transistor Tr is prevented from being shifted differently from the related art array substrate 1 of FIG. 1, in which the threshold voltage of the thin film transistor Tr of FIG. 1 is shifted due to the difference in quantities of electric charges in the light-shielding pattern 10 of FIG. 1 because the light-shielding pattern 10 of FIG. 1 is floating and is charged differently. Therefore, the characteristics of the thin film transistor Tr are prevented from being lowered, and the reliability of the thin film transistor Tr is improved.

Figure 6:
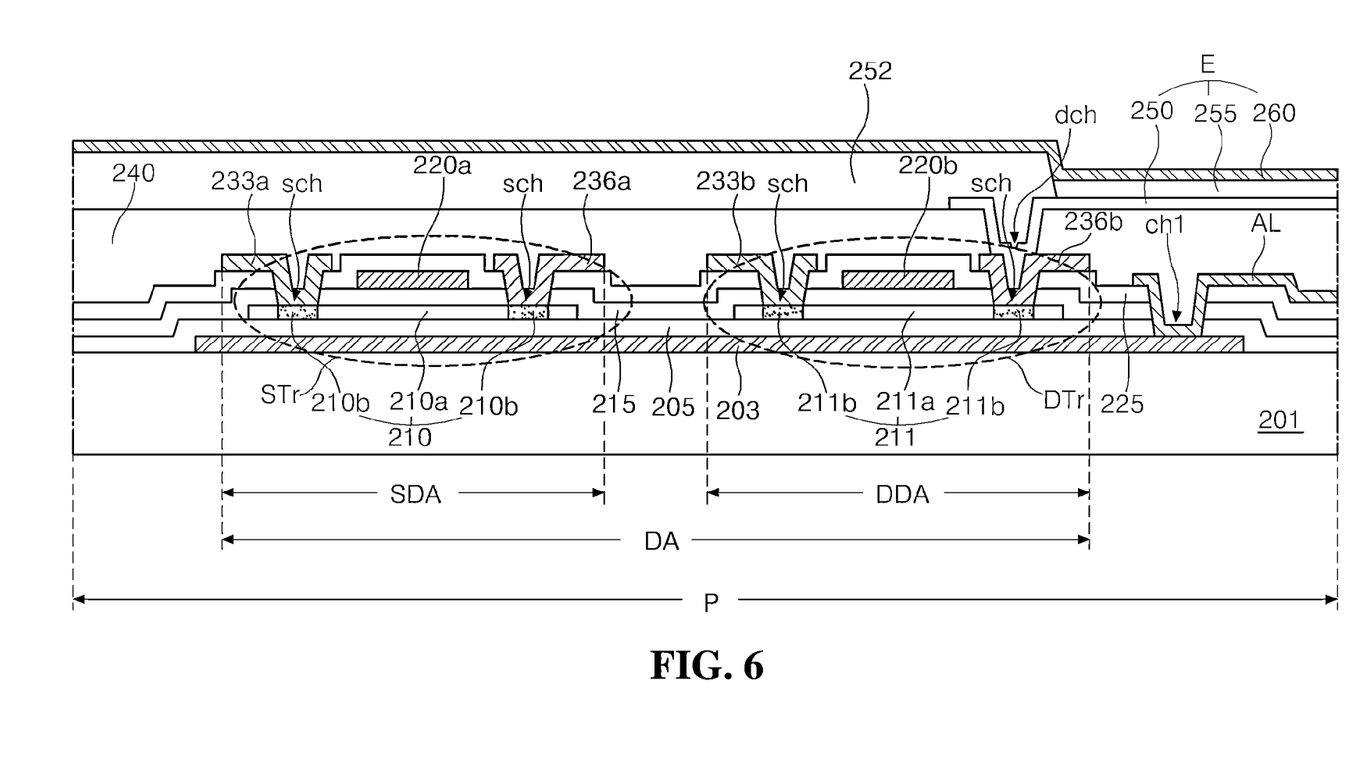
FIG. 6 is a cross-sectional view illustrating an array substrate according to a second embodiment of the present invention and shows two thin film transistors in a device area of a pixel region.

FIG. 6 is a cross-sectional view illustrating an array substrate according to a second embodiment of the present invention and shows two thin film transistors in a device area of a pixel region. The array substrate of FIG. 6 may be used for an organic light emitting diode display device.

At this time, a switching thin film transistor STr and a driving thin film transistor DTr are formed in the device area DA. In the figure, although the thin film transistors STr and DTr are separated from each other, a drain electrode 236a of the switching thin film transistor STr is connected to a gate electrode 220b of the driving thin film transistor DTr. For convenience of explanation, a switching area SDA, where the switching thin film transistor STr is formed, and a driving area DDA, where the driving thin film transistor DTr is formed, are defined in the device area DA.

In the array substrate 201 according to the second embodiment of the present invention, the cross-sectional structure of each of the thin film transistors STr and DTr is the same as the thin film transistor Tr of the array substrate 101 of FIG. 3 according to the first embodiment of the present invention, and explanation for the same parts will be omitted.

As shown in FIG. 6, a light-shielding pattern 203 is formed in each device area DA on the substrate 201, and the light-shielding pattern 203 corresponds to is overlapped by both the switching area SDA and the driving area DDA.

In the array substrate 101 of FIG. 3 according to the first embodiment of the present invention, one light-shielding pattern 103 of FIG. 3 corresponds to is overlapped by each thin film transistor Tr of FIG. 3 in the device area DA of FIG. 3. On the other hand, in the array substrate 201 according to the second embodiment of the present invention, one light-shielding pattern 203 corresponds to is overlapped by a plurality of thin film transistors STr and DTr in the device area DA. In the second embodiment of the present invention, the light-shielding pattern 203 may correspond to and is overlapped by two or more thin film transistors.

The light-shielding pattern 203 may be formed of a metallic material or a semiconductor material. The semiconductor material may be, for examples, amorphous silicon, polycrystalline silicon or an oxide semiconductor material. Further, the semiconductor material may be, for example, impurity-doped amorphous silicon, a conducted oxide semiconductor material or impurity-doped polycrystalline silicon having the improved conductive property.

A buffer layer 205 is formed on the light-shielding pattern 203 on the whole substrate 201.

In addition, oxide semiconductor layers 210 and 211, a gate insulating layer 215, gate electrodes 220a and 220b, an inter-insulating layer 225 having semiconductor layer contact holes sch, and source electrodes 233a and 233b and drain electrodes 236a and 236b are sequentially formed on the buffer layer 205 corresponding to the light-shielding pattern 203. The source electrodes 233a and 233b and the drain electrodes 236a and 236b contact conductive portions 210b and 211b of the oxide semiconductor layers 210 and 211 through the semiconductor layer contact holes sch, respectively.

The oxide semiconductor layer 210, the gate insulating layer 215, the gate electrode 220a, the inter-insulating layer 225, and the source and drain electrodes 233a and 236a, which are sequentially layered in the switching area SDA, constitute the switching thin film transistor STr. The oxide semiconductor layer 211, the gate insulating layer 215, the gate electrode 220b, the inter-insulating layer 225, and the source and drain electrodes 233b and 236b, which are sequentially layered in the driving area DDA, constitute the driving thin film transistor DTr Although one driving thin film transistor DTr is formed in the driving area DDA, two or more driving thin film transistors, each of which has the same structure, may be formed in the driving area DDA. At this time, the driving thin film transistors may be variously connected to each other according to the need.

The gate electrode 220a of the switching thin film transistor STr in the switching area SDA is connected to a gate line (not shown), which is formed on the same layer as the gate electrode 220a in a first direction, and the source electrode 233a of the switching thin film transistor STr is connected to a data line (not shown), which is formed on the same layer as the source electrode 233a in a second direction that crosses the gate line. The driving thin film transistor DTr is connected to the switching thin film transistor STr and a power line (not shown), which is formed parallel to the gate line or the data line.

Meanwhile, an auxiliary line AL is formed on the same layer as the source electrodes 233a and 233b and the drain electrodes 236a and 236b and is connected to the light-shielding pattern 203 through a contact hole ch1 formed in the inter-insulating layer 225, the gate insulating layer 215 and the buffer layer 205.

The auxiliary line AL may be formed on the same layer as the gate electrodes 220a and 220b and may be connected to the light-shielding pattern 203 through a contact hole formed in the gate insulating layer 215 and the buffer layer 205. The auxiliary line AL may be formed on the same layer and of the same material as the light-shielding pattern 203 and may be directly connected to the light-shielding pattern 203 to form one-united body.

A first passivation layer 240 is formed on the switching thin film transistor STr and the driving thin film transistor DTr. The first passivation layer 240 has a drain contact hole dch exposing the drain electrode 236b of the driving thin film transistor DTr.

A first electrode 250 is formed on the first passivation layer 240 in each pixel region P. The first electrode 250 contacts the drain electrode 236b of the driving thin film transistor DTr through the drain contact hole dch.

A bank 252 is formed on the first electrode 250 in a boundary of the pixel region P including the device area DA. The bank 252 overlaps edges of the first electrode 250. An organic light emitting layer 255 is formed on the first electrode 250 in the pixel region P surrounded by the bank 252. A second electrode 260 is formed on the organic light emitting layer 255 all over the display area. Accordingly, the array substrate 201 according to the second embodiment of the present invention is completed.

The first electrode 250, the organic light emitting layer 255 and the second electrode 260, which are sequentially layered in the pixel region P, constitute an organic electroluminescent diode E.

Figure 7A:
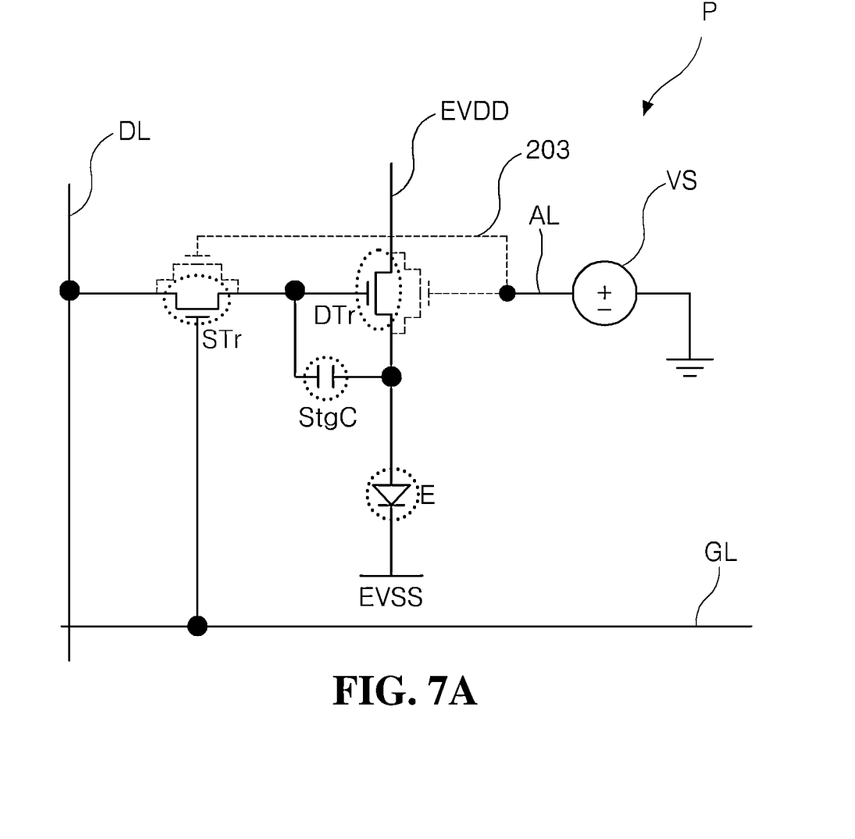
FIGS. 7A and 7B are circuit diagrams for a pixel region of an array substrate according to the second embodiment of the present invention.
Figure 7B:
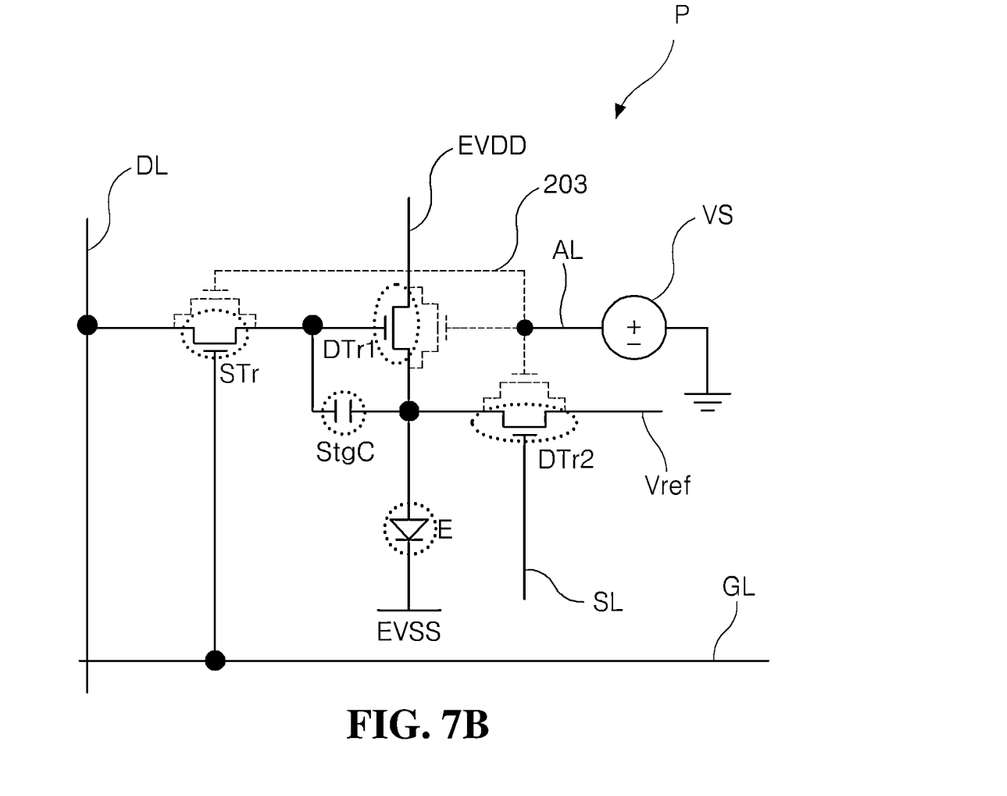

FIGS. 7A and 7B are circuit diagrams for a pixel region of an array substrate according to the second embodiment of the present invention. FIG. 7A shows a switching thin film transistor and a driving thin film transistor in a device area of a pixel region, and FIG. 7B shows a switching thin film transistor and two driving thin film transistors in a device area of a pixel region.

In FIG. 7A, the pixel region is defined by a gate line GL, a data line DL and a power line EVDD. A switching thin film transistor STr, a driving thin film transistor DTr, a storage capacitor StgC, and an organic electroluminescent diode E are formed in the pixel region.

More particularly, the gate line GL is formed in a first direction, the data line DL is formed in a second direction that crosses the first direction, and the power line EVDD is formed apart from the data line DL to apply a power supply voltage.

Additionally, in the pixel region, the switching thin film transistor STr is formed at a crossing portion of the gate line GL and the data line D1, and the driving thin film transistor DTr is electrically connected to the switching thin film transistor STr.

Here, a first electrode of the organic electroluminescent diode E is connected to a drain electrode of the driving thin film transistor DTr, and a source electrode of the driving thin film transistor DTr is connected to the power line EVDD. Therefore, the driving thin film transistor DTr provides the power supply voltage from the power line EVDD to the organic electroluminescent diode E.

Moreover, the storage capacitor StgC is formed between the gate electrode and the source electrode of the driving thin film transistor DTr.

Accordingly, when a signal is applied to the switching thin film transistor STr through the gate line GL, the switching thin film transistor STr turns on. A data voltage is provided to the gate electrode of the driving thin film transistor DTr through the data line DL, and the driving thin film transistor DTr turns on. The power supply voltage is applied to the driving thin film transistor DTr from the power line EVDD, and the organic electroluminescent diode E emits light.

At this time, if the driving thin film transistor DTr turns on, levels of currents flowing in the organic electroluminescent diode E are determined, and thus the organic electroluminescent diode E shows gray scale.

Meanwhile, in FIG. 7B, a switching thin film transistor STr and two driving thin film transistors DTr1 and DTr2 are formed in the device area of the pixel region. The additional driving thin film transistor DTr2 may be referred to as a sensing thin film transistor. A drain electrode of the sensing thin film transistor DTr2 is connected to a drain electrode of the driving thin film transistor DTr1, a gate electrode of the sensing thin film transistor DTr2 is connected to a sensing signal line SL, and a source electrode of the sensing thin film transistor DTr2 is connected to a common signal line Vref, which may be referred to as a reference line.

When the sensing thin film transistor DTr2 is added in the device area, the sensing signal line SL and the common signal line Vref are also added and connected to the sensing thin film transistor DTr2. The sensing thin film transistor DTr2 is able to stably control a voltage applied to the organic electroluminescent diode E, and image qualities of the display device can be improved.

In the array substrate according to the second embodiment of the present invention having the above-mentioned structure, one light-shielding pattern 203 is formed in the device area of each pixel region. The light-shielding pattern 203 is connected to a power supply means VS or a ground (not shown).

Referring to FIG. 6 and FIGS. 7A and 7B, the oxide semiconductor layers 210 and 211 of the switching and driving thin film transistors STr and DTr (DTr1 and DTr2) overlaps the light-shielding pattern 203 with the buffer layer 205 interposed therebetween, and there is an effect that each of the switching and driving thin film transistors STr and DTr (DTr1 and DTr2) has a second gate electrode.

However, since the light-shielding pattern 203 is connected to the power supply means VS or the ground (not shown), a very low constant voltage such as −1V, 0V or +1V, for example, is applied to the light-shielding pattern 203. The constant voltage is lower than the threshold voltage Vth, which is a minimum gate voltage required to turn on the thin film transistors STr and DTr (DTr1 and DTr2). Therefore, a channel is not substantially formed in the oxide semiconductor layers 210 and 211 due to the light-shielding pattern 203.

Furthermore, the quantity of electric charges in the light-shielding pattern 203 is constant for each location, and the electric potential at the light-shielding pattern 203 is constant. Accordingly, the threshold voltages of the thin film transistors STr and DTr (DTr1 and DTr2) are prevented from being shifted due to a difference in the quantities of electric charges in the light-shielding pattern 203. Therefore, the characteristics of the thin film transistors STr and DTr (DTr1 and DTr2) are prevented from being lowered, and the reliability of the thin film transistors STr and DTr (DTr1 and DTr2) are improved. Moreover, afterimages due to this are prevented, and image qualities of the display device are improved.

Meanwhile, although not shown in the figures, the light-shielding pattern may have a width the same as or larger than that of the display area, and the light-shielding patterns in the device area on the same line may be connected to each other to form one-united body. In this case, the auxiliary line may be formed in the non-display area, and the light-shielding pattern is connected to the auxiliary line in the non-display area. At this time, the auxiliary line is connected to the power supply means or the ground. When the auxiliary line is formed in the non-display area, an organic light emitting diode display device has more improved aperture ratio.

Additionally, in FIGS. 7A and 7B, the light-shielding pattern 203 is formed under the oxide semiconductor layers of the switching and driving thin film transistors STr and DTr of FIG. 7A (DTr1 and DTr2 of FIG. 7B) and is connected to the auxiliary line AL. Alternatively, there may be no light-shielding pattern under the oxide semiconductor layer of the switching transistor STr, and the light-shielding pattern 203 may be formed only under the oxide semiconductor layer of the driving thin film transistor DTr of FIG. 7A or the oxide semiconductor layers of the driving thin film transistors DTr1 and DTr2 of FIG. 7B and may be connected to the auxiliary line A1.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate having at least two thin film transistors, comprising:
    gate and data lines formed on the array substrate and defining a pixel region, wherein the thin film transistors are located in a device area of the pixel region;
    a light-shielding pattern arranged on the array substrate in the device area, wherein the thin film transistors overlap the light-shielding pattern, and wherein the light-shielding pattern absorbs or reflects light;
    an auxiliary line connected to the light-shielding pattern and supplying a constant voltage to the light-shielding pattern, wherein the auxiliary line is parallel to and spaced apart from one of the gate and data lines;
    a buffer layer of an inorganic material located on the light-shielding pattern and a surface of the array substrate;
    a semiconductor layer located on the buffer layer and the light-shielding pattern;
    an inter-insulating layer on the semiconductor layer,
    wherein the semiconductor layer includes an active portion located entirely on the light-shielding pattern and having a channel formed thereon, and conductive portions located on sides of the active portion,
    wherein the thin film transistors include a switching thin film transistor and a driving thin film transistor in the device area, and
    wherein the thin film transistors are separated from each other, wherein a drain electrode of the switching thin film transistor is connected to a gate electrode of the driving thin film transistor.

2. The array substrate of claim 1, wherein the auxiliary line is arranged on a layer different from the light-shielding pattern and connected to the light-shielding pattern via a first contact hole.

3. The array substrate of claim 1, wherein the auxiliary line and the light-shielding pattern form a single body.

4. The array substrate of claim 1, wherein the light-shielding pattern is one of a metallic material or a semiconductor material.

5. The array substrate of claim 4, wherein the semiconductor material includes one of amorphous silicon, polycrystalline silicon, and oxide semiconductor material.

6. The array substrate of claim 1, wherein the semiconductor layer is one of indium gallium zinc oxide (IGZO), zinc tin oxide (ZTO) and zinc indium oxide (ZIO).

7. An array substrate, comprising:
at least two thin film transistors;
a light-shielding pattern overlapping one of the thin film transistors, wherein the light-shielding pattern absorbs or reflects light;
an auxiliary line connected to the light-shielding pattern and supplying a constant voltage to the light-shielding pattern;
a buffer layer on the light-shielding pattern;
wherein a semiconductor layer of the one of the thin film transistors is located on the buffer layer and overlaps the light-shielding pattern,
wherein the thin film transistors include a switching thin film transistor and a driving thin film transistor in a device area, and
wherein a drain electrode of the switching thin film transistor is connected to a gate electrode of the driving thin film transistor.

8. The array substrate of claim 7, wherein the light-shielding pattern overlaps the other of the thin film transistors.

9. The array substrate of claim 7, wherein the auxiliary line is arranged on a layer different from the light-shielding pattern and connected to the light-shielding pattern via a first contact hole.

10. The array substrate of claim 7, wherein the auxiliary line and the light-shielding pattern form a single body.

11. The array substrate of claim 7, wherein the light-shielding pattern is one of a metallic material or a semiconductor material.

12. The array substrate of claim 11, wherein the semiconductor material includes one of amorphous silicon, polycrystalline silicon, and oxide semiconductor material.

13. The array substrate of claim 7, wherein the semiconductor layer is one of indium gallium zinc oxide (IGZO), zinc tin oxide (ZTO) and zinc indium oxide (ZIO).

14. The array substrate of claim 7, wherein the one of the thin film transistors further includes a gate insulation layer and a gate electrode on an active portion of the semiconductor layer.

15. The array substrate of claim 14, wherein the gate insulation layer is located on an area corresponding to the gate electrode.

16. The array substrate of claim 14, wherein the gate insulation layer is located on the buffer layer.

17. The array substrate of claim 7, further comprising second contact holes in an inter-insulating layer on the semiconductor layer and exposing a surface of conductive portions of the semiconductor layer.

18. The array substrate of claim 17, wherein the one of the thin film transistors further includes source and drain electrodes located in the device area on the inter-insulating layer, wherein the source and drain electrodes respectively contact one of the conductive portions via the second contact holes.

19. The array substrate of claim 18, further comprising a first passivation layer over the array substrate, wherein the first passivation layer is one of an inorganic insulating material and an organic insulating material.

20. The array substrate of claim 19, further comprising a pixel electrode on the first passivation layer, wherein the pixel electrode contacts the drain electrode via a drain contact hole.

* * * * *